(12) United States Patent
Park

(10) Patent No.: US 9,177,648 B2
(45) Date of Patent: Nov. 3, 2015

(54) 3D NON-VOLATILE MEMORY DEVICE HAVING WORDLINES WITH LARGE WIDTH

(71) Applicant: SK hynix Inc., Gyeonggi-do (KR)

(72) Inventor: Jin-Su Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 155 days.

(21) Appl. No.: 14/040,043

(22) Filed: Sep. 27, 2013

(65) Prior Publication Data

US 2014/0355346 A1   Dec. 4, 2014

(30) Foreign Application Priority Data

May 31, 2013   (KR) ......................... 10-2013-0062288

(51) Int. Cl.
*G11C 16/02* (2006.01)
*G11C 16/04* (2006.01)
*G11C 16/34* (2006.01)
*H01L 27/115* (2006.01)
*H01L 29/792* (2006.01)

(52) U.S. Cl.
CPC ........ *G11C 16/0483* (2013.01); *G11C 16/3427* (2013.01); *H01L 27/11582* (2013.01); *H01L 29/7926* (2013.01)

(58) Field of Classification Search
CPC ................... H01L 27/11578; H01L 27/11582; H01L 29/66833; H01L 29/792; H01L 29/7926; H01L 29/0688; H01L 29/42344; G11C 16/0483
USPC ..................................................... 365/185.11
See application file for complete search history.

(56) References Cited

U.S. PATENT DOCUMENTS

| | | | |
|---|---|---|---|
| 8,760,925 B2 * | 6/2014 | Li | ............................ 365/185.17 |
| 2010/0207190 A1 | 8/2010 | Katsumata et al. | |
| 2011/0031550 A1 | 2/2011 | Komori et al. | |
| 2013/0229871 A1 * | 9/2013 | Li | ............................ 365/185.11 |

* cited by examiner

*Primary Examiner* — Richard Elms
*Assistant Examiner* — Xiaochun L Chen
(74) *Attorney, Agent, or Firm* — IP & T Group LLP

(57) ABSTRACT

A nonvolatile memory device includes first to N-th memory blocks, wherein N is an integer and N≥3. Each memory block, of the first to N-th memory blocks comprises first to (M−1)-th strings, wherein each string, of the first to (M−1)-th strings, includes drain-side memory cells, source-side memory cells, and a pipe transistor connecting the drain-side memory cells and the source-side memory cells, where M is an integer and M≥2, and an M-th string, including drain-side memory cells formed adjacent to the first string, of a first to (M−1)-th strings, and including source-side memory cells formed adjacent to an (M−1)-th string of the first to (M−1)-th strings.

12 Claims, 12 Drawing Sheets

3D NON-VOLATILE MEMORY DEVICE HAVING WORDLINES WITH LARGE WIDTH

CROSS-REFERENCE TO RELATED APPLICATIONS

The present application claims priority of Korean Patent Application No. 10-2013-0062288, filed on May 31, 2013, which is incorporated herein by reference in its entirety.

BACKGROUND

1. Field

Exemplary implementations of the present invention relate to a nonvolatile memory device, and more particularly, to a nonvolatile memory including memory cells stacked arranged in a three-dimensional manner.

2. Description of the Related Art

A demand for high integration of memory devices is increasing. Conventionally, an integration degree of a memory device has been increased by reducing the size of memory cells that are two-dimensionally arranged over a semiconductor substrate. However, there is a physical limit to reducing the size of memory cells. For this reason, a method for increasing the integration degree of a memory device by three-dimensionally arranging memory cells over a semiconductor substrate has been proposed, as disclosed in Korean Patent Laid-open Publication No. 2013-005434. When the memory cells are arranged in a three-dimensional manner, the area of the semiconductor substrate may be efficiently utilized, and the integration degree may be improved more than when the memory cells are arranged in a two-dimensional manner.

FIG. 1 is a configuration diagram of a conventional three-dimensional nonvolatile memory device.

Referring to FIG. 1, the three-dimensional nonvolatile memory device includes a plurality of memory blocks BLK1 to BLK3.

In an X-Y plane of FIG. 1, one memory block includes two cell strings. For example, the memory block BLK2 includes two cell strings formed in a U-shape. A first cell string of the memory block BLK2 includes memory cells stacked between a drain select transistor, controlled by a drain select line DSL0, and a pipe transistor, corresponding to a left transistor of transistors controlled by a pipe gate PG, and memory cells stacked between the pipe transistor, corresponding to the left transistor of transistors controlled by the pipe gate PG, and a source select transistor corresponding to a left transistor of transistors controlled by a source select line SSL. The memory cells stacked between the drain select transistor and the pipe transistor are controlled by word lines WL8 to WL15 and the memory cells stacked between the pipe transistor and the source select transistor are controlled by word lines WL0 to WL7. Furthermore, a second cell string of the memory block BLK2 includes memory cells stacked between a drain select transistor, controlled by a drain select line DSL1, and a pipe transistor, corresponding to a right transistor of transistors, controlled by the pipe gate PG and memory cells stacked between the pipe transistor, corresponding to the right transistor of transistors controlled by the pipe gate PG, and a source select transistor corresponding to a right transistor of transistors controlled by the source select line SSL. The memory cells stacked between the drain select transistor and the pipe transistor are controlled by the word lines WL8 to WL15, and the memory cells stacked between the pipe transistor and the source select transistor are controlled by the word lines WL0 to WL7.

Each of the memory blocks BLK1 to BLK3 corresponds to the unit of an erase operation among operations of the nonvolatile memory device. Furthermore, except for a bit line BL and a source line SL in FIG. 1, lines represented by the same symbols but belonging to different memory blocks are different from each other. For example, different voltages may be applied to the cord line WL of the memory block BLK1 and the word line WL3 of the memory block BLK2, respectively.

FIG. 2 is a cross-sectional view of FIG. 1. Referring to FIG. 2, it can be seen that cells strings are arranged in a Z-axis direction as well as on the X-Y plane of FIG. 1. In FIGS. 2, 201, 202, 203, and 204 represent insulators for isolating word lines WL of the respective memory blocks BLK1, BLK2, and BLK3. For example, the insulator 202 electrically isolates word lines WL<15:8> of the memory block BLK1 from word lines WL<15:8> of the memory block BLK2. Thus, the memory blocks BLK1 and BLK2 may independently operate.

Since two adjacent cell strings share the word lines WL<7:0>, among the word lines of the memory blocks BLK1 to BLK3, the word lines WL<7:0> may have a large width. However, since adjacent cell strings do not share the word lines WL<15:8>, the word lines WL<15:8> have a width smaller than the width of word lines WL<7:0>. Since the word lines WL<15:8> have a smaller width, they have a large resistance value. Thus, the word lines WL<15:8> may degrade the performance of the nonvolatile memory device. Furthermore, when the word lines WL 15:8>, having a smaller width, are stacked to fabricate the nonvolatile memory device, the difficulty level of the fabrication process inevitably increases.

SUMMARY

Various implementations are directed to a technique capable of forming word lines with a large width in a stacked nonvolatile memory.

An exemplary nonvolatile memory device includes first to N-th memory blocks, wherein N is an integer and N≥3, and wherein each memory block, of the first to N-th memory blocks, comprises first to (M−1)-th strings, wherein each string, of the first to (M−1)-th strings, includes drain-side memory cells, source-side memory cells, and a pipe transistor connecting the drain-side memory cells and the source-side memory cells, where M is an integer and M≥2; and an M-th string, including drain-side memory cells formed adjacent to the first string, of a first to (M−1)-th strings, and including source-side memory cells formed adjacent to an (M−1)-th string of the first to (M−1)-th strings.

An exemplary nonvolatile memory device includes a plurality of memory blocks, wherein each memory block, of the plurality memory blocks, comprises a first plurality of drain-side memory cells arranged in a first drain-side string and a first plurality of source-side memory cells arranged in a first source-side string, wherein the first drain-side string and the first source-side string are connected by a first pipe transistor; a second plurality of drain side memory cells arranged in a second drain-side string and a second plurality of source-side memory cells arranged in a second source-side string, wherein the second drain-side string is connected to a second source-side string of an adjacent memory block, of the plurality of memory block, via a second pipe transistor, and the second source-side string is connected to a second drain-side string, of a different adjacent memory block, of the plurality of memory blocks, via a third pipe transistor.

DETAILED DESCRIPTION

Figure 1:
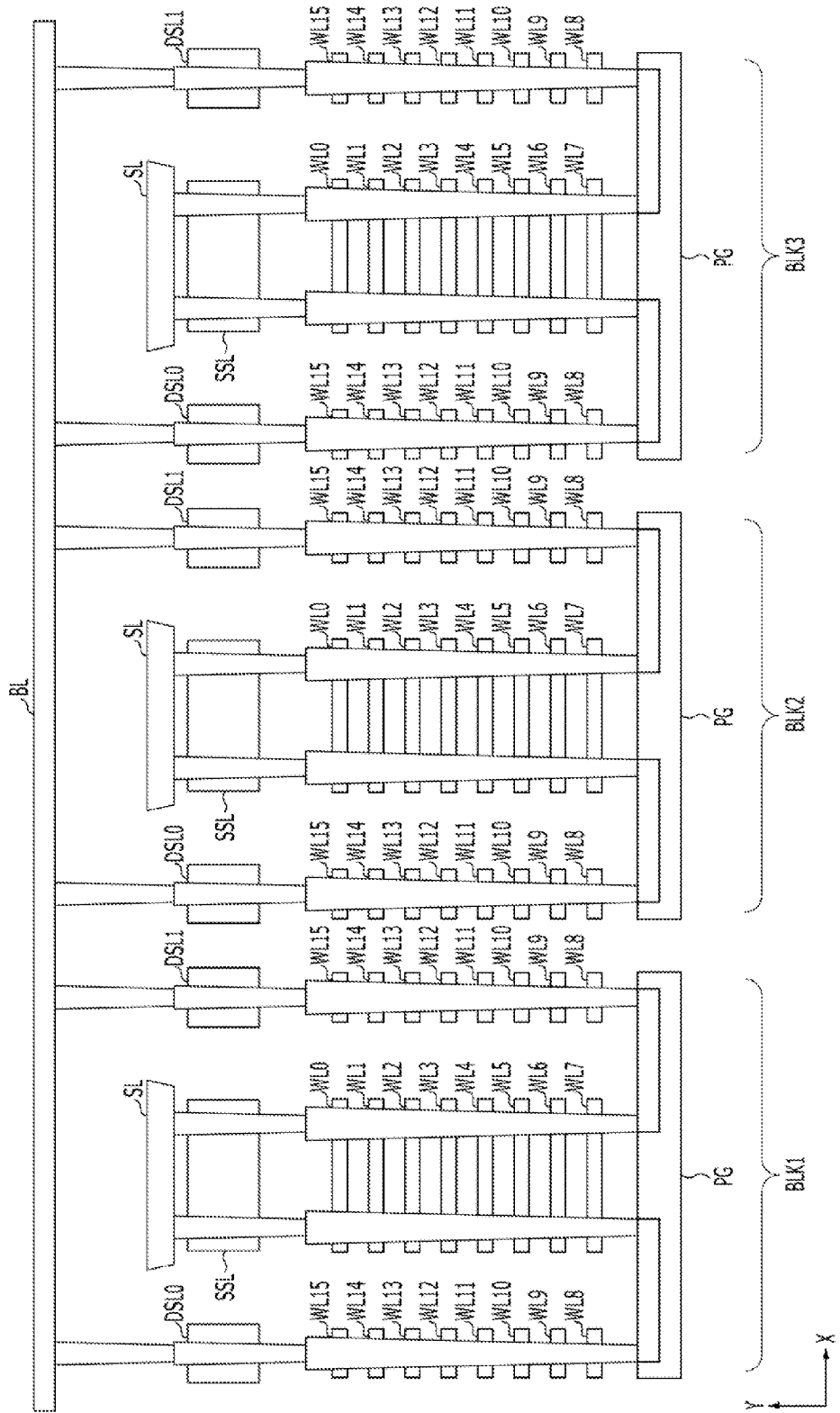
FIG. 1 is a configuration diagram of a conventional three-dimensional nonvolatile memory device.

Various implementations will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the implementations. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 3:
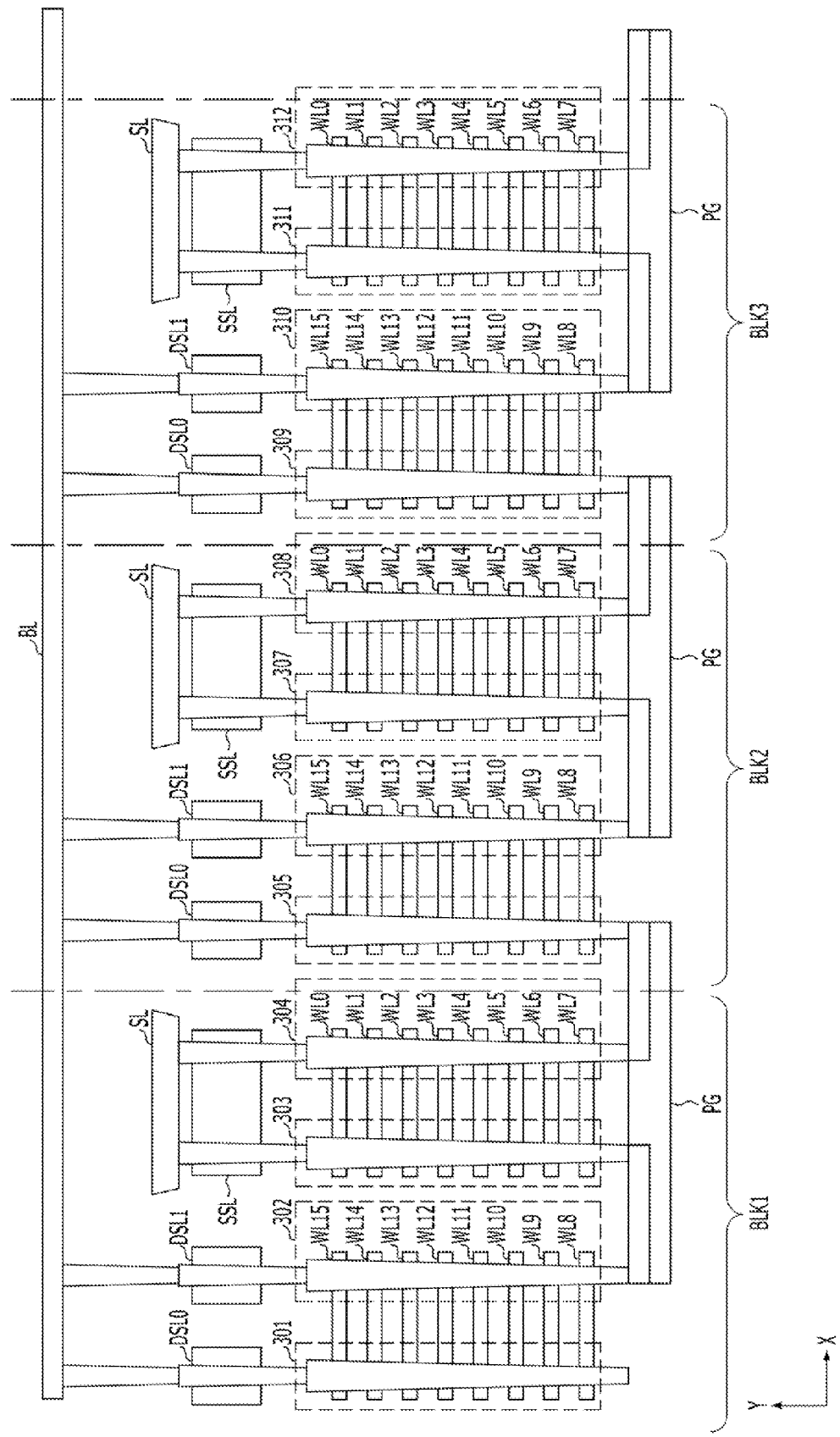
FIG. 3 is a configuration diagram of an exemplary nonvolatile memory device

FIG. 3 is a configuration diagram of an exemplary nonvolatile memory device.

Referring to FIG. 3, the nonvolatile memory device includes a plurality of memory blocks BLK1 to BLK3.

As shown in FIG. 3, in an X-Y plane, one memory block includes two cell strings. Each of the memory blocks BLK1 to BLK3 includes one string having one complete string and two half strings formed therein.

The memory block BLK2 includes a U-shaped complete string, a drain-side half string, and a source-side half string. The U-shaped complete string includes drain-side memory cells 306, source-side memory cells 307, and a pipe transistor connecting the memory cells 306 and 307 and corresponding to a left transistor of two transistors controlled by a pipe gate PG. The drain-side half string includes drain-side memory cells 305, and the source-side half string includes source-side memory cells 308. When two half strings 305 and 308 are combined together, one string may be formed. Thus, it may be considered that the memory block BLK2 includes two strings based on the X-Y plane. Since the drain-side memory cells 305 and 306 are stacked and formed at a side where drain select transistors controlled by drain select lines DSL0 and DSL1 are positioned, they are named drain-side memory cells, and since the source-side memory cells 307 and 308 are stacked and formed at a side where source select transistors controlled by a source select line SSL are positioned, they are named source-side memory cells. The memory block BLK1 also includes one complete string 302 and 303 and two half strings 301 and 304 like the memory block BLK2. The memory block BLK3 also includes one complete string 310 and 311 and two half strings 309 and 312 like the memory block BLK2. That is, the memory blocks BLK1 to BLK3 include a complete string in the center thereof and a half string at the boundary between the respective blocks.

The half strings of the adjacent memory blocks are connected through a pipe transistor. For example, the source-side half string 304 of the memory block BLK1 and the drain-side half string 305 of the memory block BLK2 are connected through a pipe transistor therebetween, and the source-side half string 308 of the memory block BLK2 and the drain-side half string 309 of the memory block BLK3 are connected through a pipe transistor therebetween.

In FIG. 3, except for a bit line BL and a source line SL, lines (signals) represented by the same symbols but belonging to different memory blocks are different from each other. For example, different voltages may be applied to the word line WL7 of the memory block BLK1 and the word line WL7 of the memory block BLK3.

Figure 2:
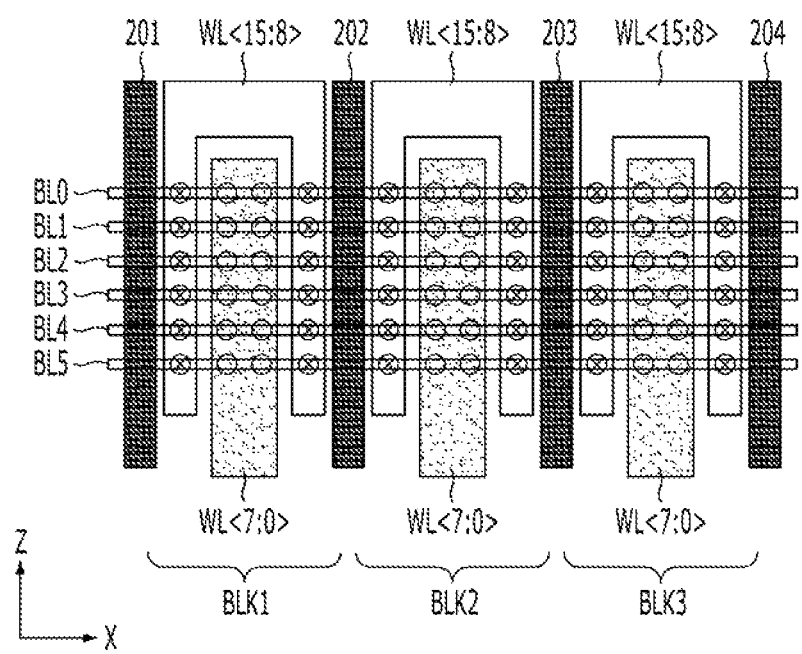
FIG. 2 is a cross-sectional view of FIG. 1.
Figure 4:
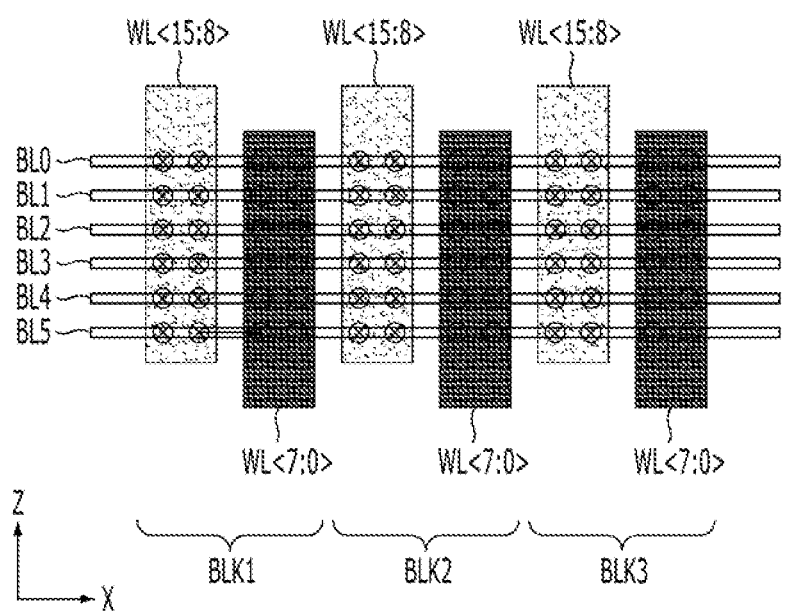
FIG. 4 is a cross-sectional view of FIG. 3.

FIG. 4 is a cross-sectional view of FIG. 3. Referring to FIG. 4, it can be seen that cell strings are arranged in a Z-axis direction as well as on the X-Y plane of FIG. 3. Since half strings of adjacent blocks are connected to each other; the insulators 201, 202, 203, and 204 (illustrated in FIG. 2) may not be used.

Referring to FIGS. 3 and 4, all of the word lines WL0 to WL15, inside the memory blocks BLK1 to BLK3, are shared by adjacent memory cells, and are formed with a large width. Therefore, it is possible to solve the problems of the conventional memory device, which occur due to the conventional word lines WL8 to WL15 having a width that is smaller than the width of conventional word lines WL0 to WL7. That is, the performance degradation of the memory device and the increase in difficulty level of the fabrication process may be substantially prevented.

Figure 5:
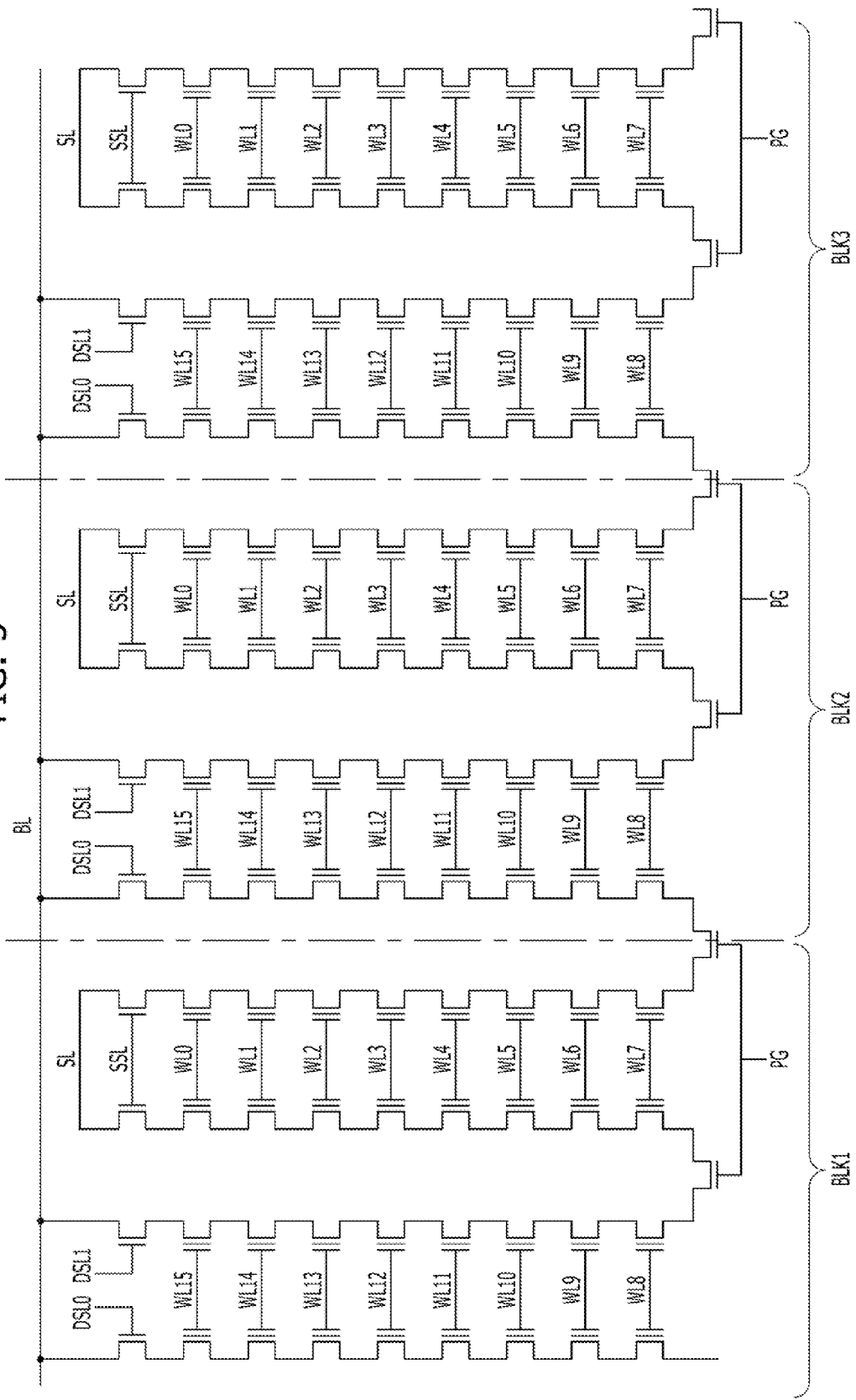
FIG. 5 is a circuit diagram illustrating exemplary electrical connections of FIG. 3.

FIG. 3 illustrates that one memory block includes two strings (one complete string+ two half strings). However, in an alternative exemplary implementation, one memory block may include three or more strings. In this case, one memory block may include strings arranged in order of [drain-side half string]–[complete string]–[complete string]– . . . [complete string]–[source-side half string] from left to right, in the X-Y plane. That is, if one memory block includes N strings, one memory block may include (N−1) complete strings and two half strings, based on the X-Y plane, FIG. 5 is a circuit diagram illustrating electrical connections of the exemplary nonvolatile memory device shown in FIG. 3. Now, exemplary operations for programming, erasing, and reading the exemplary nonvolatile memory device will be described with reference to exemplary circuit diagrams.

[Program Operation]

Figure 6:
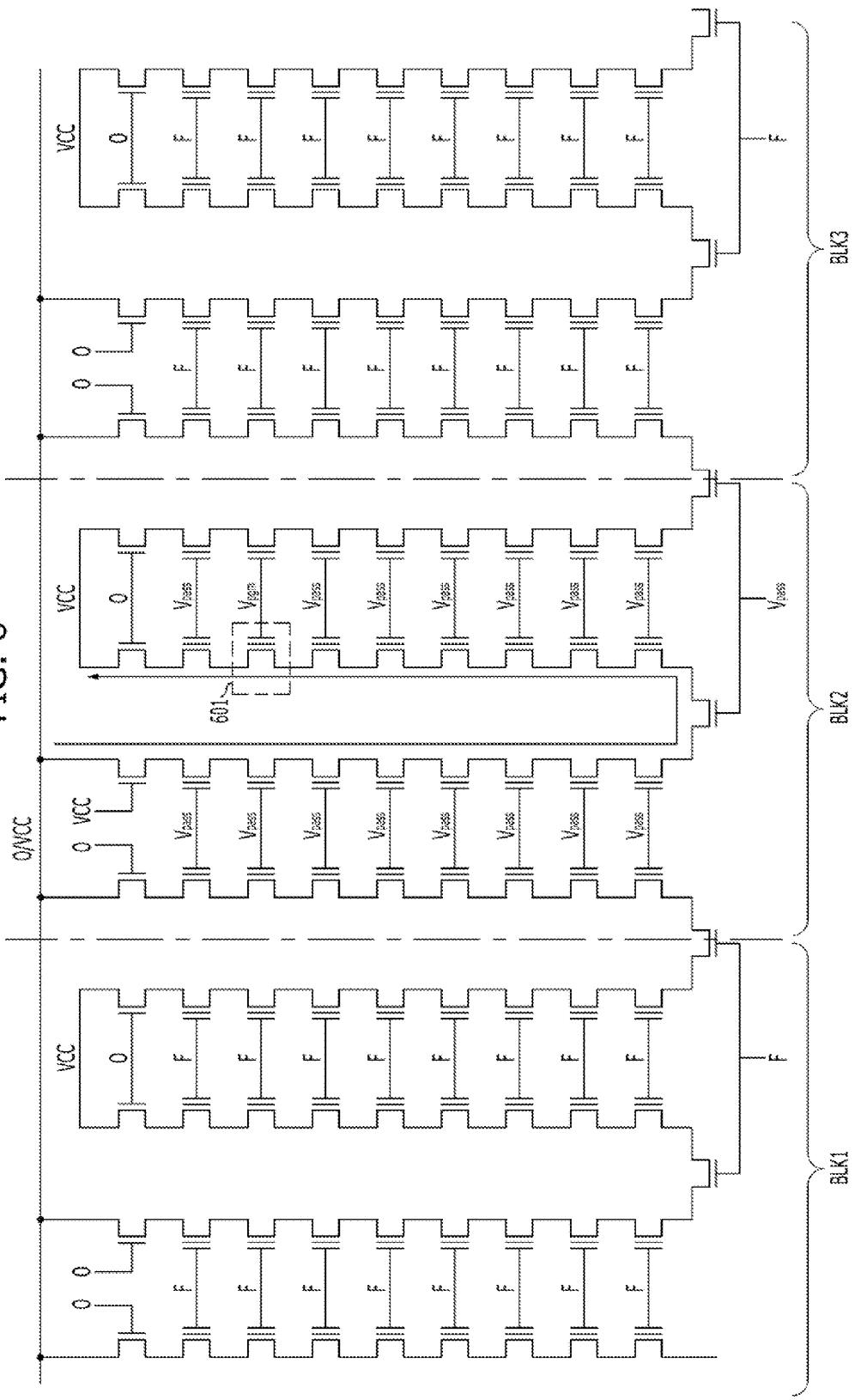
FIG. 6 is a diagram illustrating an exemplary operation for programming a memory cell 601 corresponding to a first word line WL1 in a complete string of a memory block BLK2.
Figure 7:
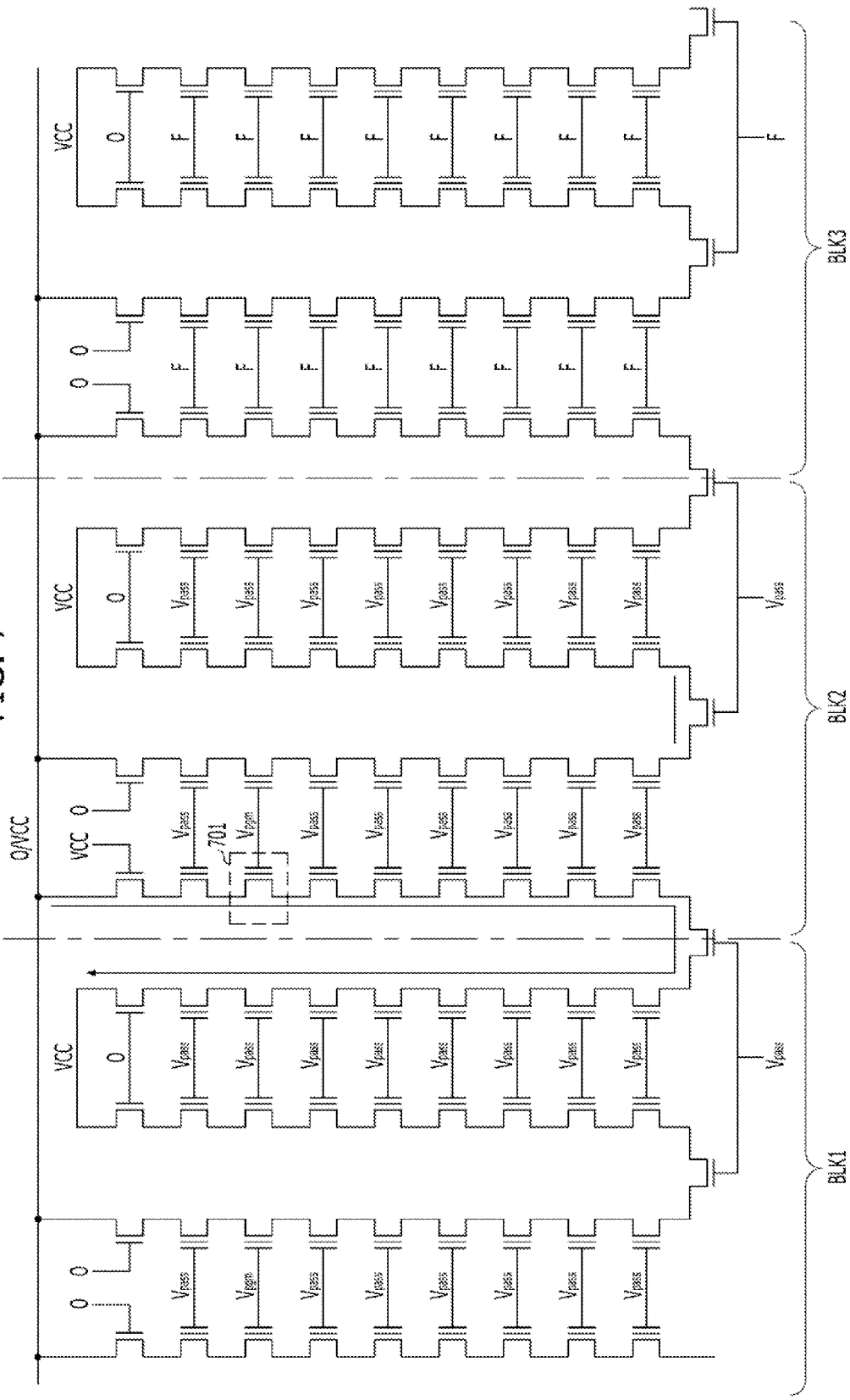
FIG. 7 is a diagram illustrating an exemplary operation for programming a memory cell 701 corresponding to a 14th word line WL14 in a drain-side half string of the memory block BLK2.
Figure 8:
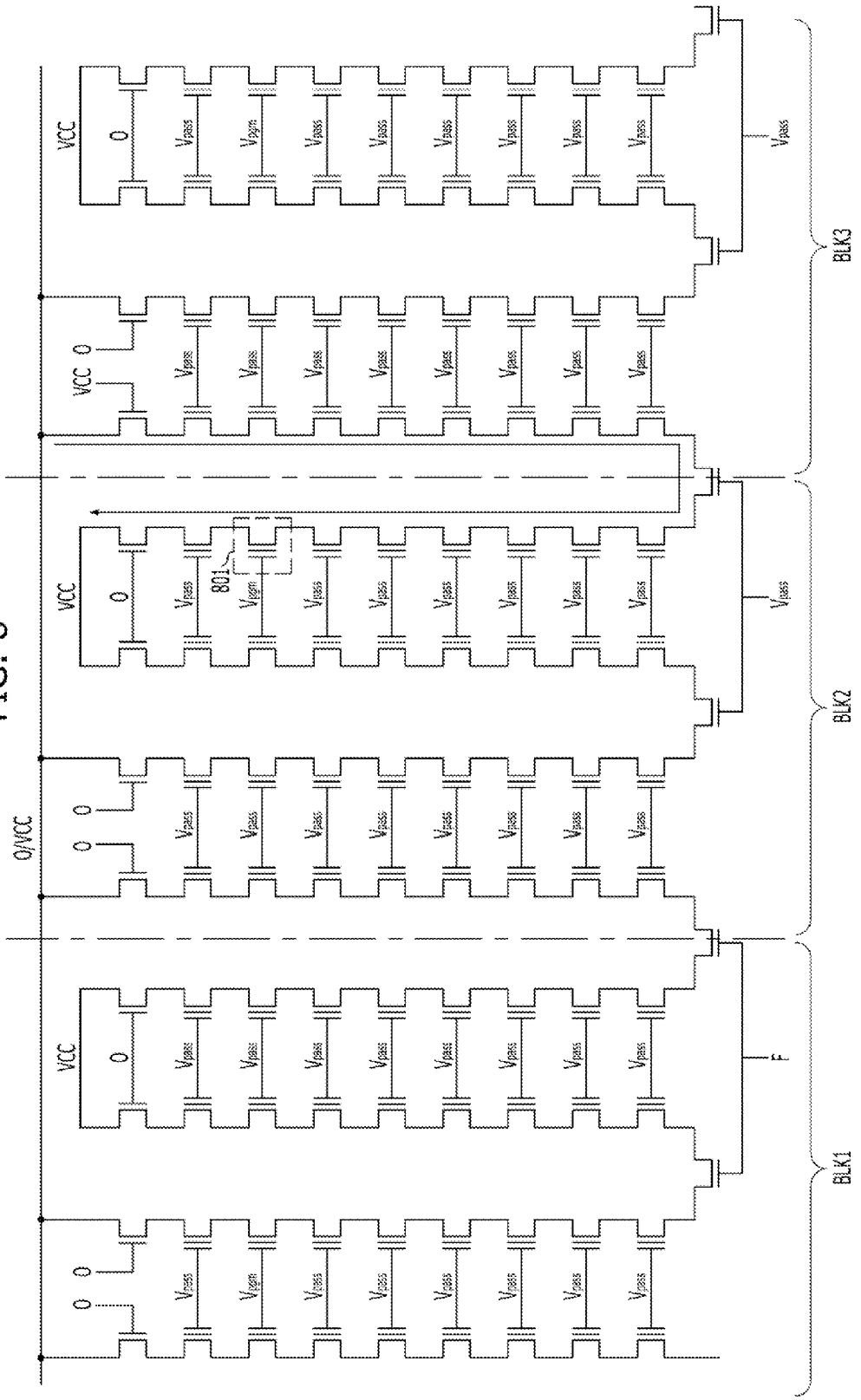
FIG. 8 is a diagram illustrating an exemplary operation for programming a memory cell 801 corresponding to a first word line WL1 in a source-side half string of the memory block BLK2.

An exemplary operation for programming exemplary nonvolatile memory device may be implemented in different ways, depending on an operation for programming a complete string of a memory block, an operation for programming a drain-side half string, or an operation for programming a source-side half string. Referring to FIGS. 6 to 8, respective exemplary program operations will be described. The exemplary operations for programming will be more easily understood by referring to FIG. 5 and FIGS. 6 to 8.

FIG. 6 is a diagram illustrating an exemplary operation for programming a memory cell 601 corresponding to a first word line WL1 in a complete string of the memory block BLK2.

Referring to FIGS. 5 and 6, a bit line BL has a voltage level of a power supply voltage VCC or ground (0V), depending on a logic value of program data. Furthermore, the power supply voltage VCC may be applied to a drain select line DSL1 of the selected block BLK2, a pass voltage Vpass, for turning on memory cells, may be applied to unselected word lines WL0 and WL2 to WL15, and a program voltage Vpgm of about 15 V to about 19V may be applied to the selected word line WL1. Thus, when the voltage level of the bit line BL is 0V, the memory cell 601 is programmed, and when the voltage level of the bit line BL is the power supply voltage VCC, the memory cell 601 is not programmed. Voltages illustrated in FIG. 6 are applied to source select lines SSL, drain select lines DSL0 and DLS1, and word lines WL0 to WL15 of the unselected blocks BLK1 and BLK3. For reference, in FIG. 6, F indicates that no voltage is applied to a corresponding line and the line is floated.

FIG. 7 is a diagram illustrating an exemplary operation for programming a memory cell 701 corresponding to a 14th word line WL14 in a drain-side half string of the memory block BLK2.

Referring to FIGS. 5 and 7, the bit line has a voltage level of the power supply voltage VCC or ground (0V), depending on a logic value of program data. Furthermore, the power supply voltage VCC may be applied to the drain select line DSL0 of the selected block BLK2. During the exemplary operation for programming the drain-side half string of the memory block BLK2, the same voltage may be applied to the word lines WL0 to WL15 and the pipe gate PG of the memory blocks BLK2 and BLK1, because the drain-side half string of the memory block BLK2 and the source-side half string of the memory block BLK1 must operate as one string. That is, in the blocks BLK1 and BLK2, the pass voltage Vpass is applied to the word lines WL0 to WL13 and WL15, the program voltage Vpgm is applied to the word line WL14, and the pass voltage Vpass may be applied to the pipe gate PG. As a result, when the bit line BL has a voltage level of 0V, only the memory cell 701 among the memory cells illustrated in FIG. 7 is programmed.

FIG. 8 is a diagram illustrating an exemplary operation for programming a memory cell 801 corresponding to a first word line WL1 in a source-side half string of the memory block BLK2.

Referring to FIG. 8, the bit line BL has a voltage level of the power supply voltage VCC or ground voltage (0V), depending on a logic value of program data. Furthermore, the power supply voltage VCC may be applied to the drain select line DSL0 of the unselected block BLK3, instead of the selected block BLK2. During the exemplary operation for programming the source-side half string of the memory block BLK2 the same voltage may be applied to the word lines WL0 to WL15 and the pipe gate PG of the memory blocks BLK2 and BLK3, because the source-side half string of the memory block BLK2 and the drain-side half string of the memory block BLK3 must operate as one string. That is, in the blocks BLK2 and BLK3, the pass voltage Vpass is applied to the word lines WL0 and WL2 to WL15, the program voltage Vpgm may be applied to the word line WL1, and the pass voltage Vpass may be applied to the pipe gate PG. As a result, when the bit line has a voltage level of 0V, only the memory cell 801 among the memory cells illustrated in FIG. 8 is programmed.

[Erase Operation]

Figure 9:
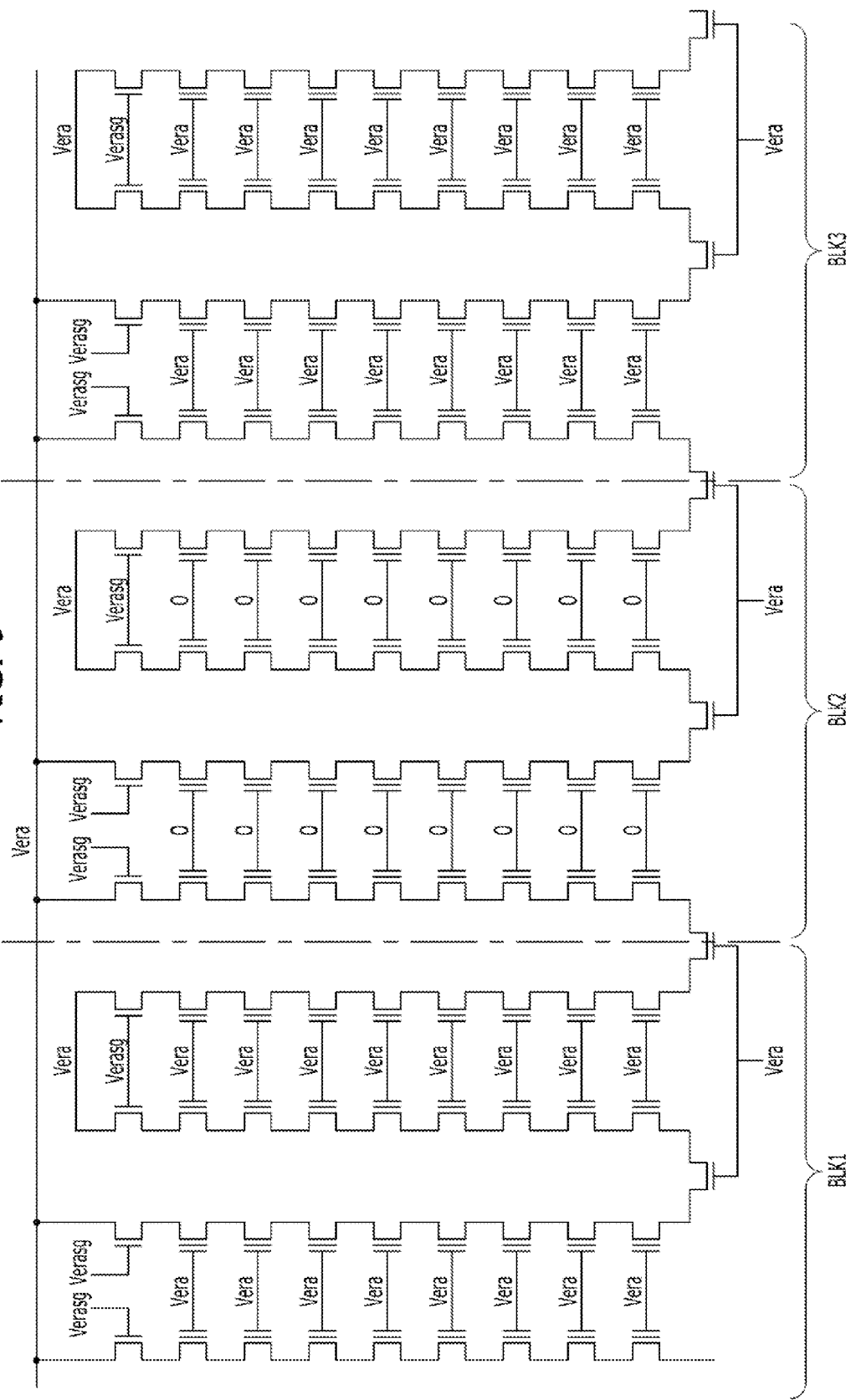
FIG. 9 is a diagram illustrating an exemplary operation for erasing the memory block BLK2.

FIG. 9 is a diagram illustrating an exemplary erase operation for the memory block BLK2.

Referring to FIG. 9, the bit line BL and the source line SL may be supplied with an erase voltage Vera of about 15V. Furthermore, the drain select line DSL0 and DSL1, of the memory blocks BLK1 to BLK3, and the source select lines SSL, of the memory blocks BLK1 to BLK3, may be supplied with a select voltage Verasg that is a high voltage lower than the erase voltage Vera, and the pipe gate PG may be supplied with the erase voltage Vera. The word lines WL0 to WL15 of the selected memory block BLK2 may have a voltage level of 0V and the word lines WL0 to WL15 of the unselected memory blocks BLK1 and BLK3 may have a voltage level substantially equal to the erase voltage Vera. Then, gate-induced drain leakage (GIRL) occurs in the drain select transistor and the source select transistor of the selected memory block BLK2, and holes are injected into a channel. As a result, all memory cells of the memory block BLK2 are erased.

For reference, the voltage levels of various lines of FIG. 9 may be set by directly applying corresponding voltages to the respective lines, or may be set by floating the corresponding lines and coupling the lines to surrounding lines. For example, the erase voltage Vera may be directly applied to the bit line BL, such that the bit line BL has a level of the erase voltage Vera. However, the bit line BL may be floated and coupled to the source line SL, so as to have a level of the erase voltage Vera.

[Read Operation]

Figure 10:
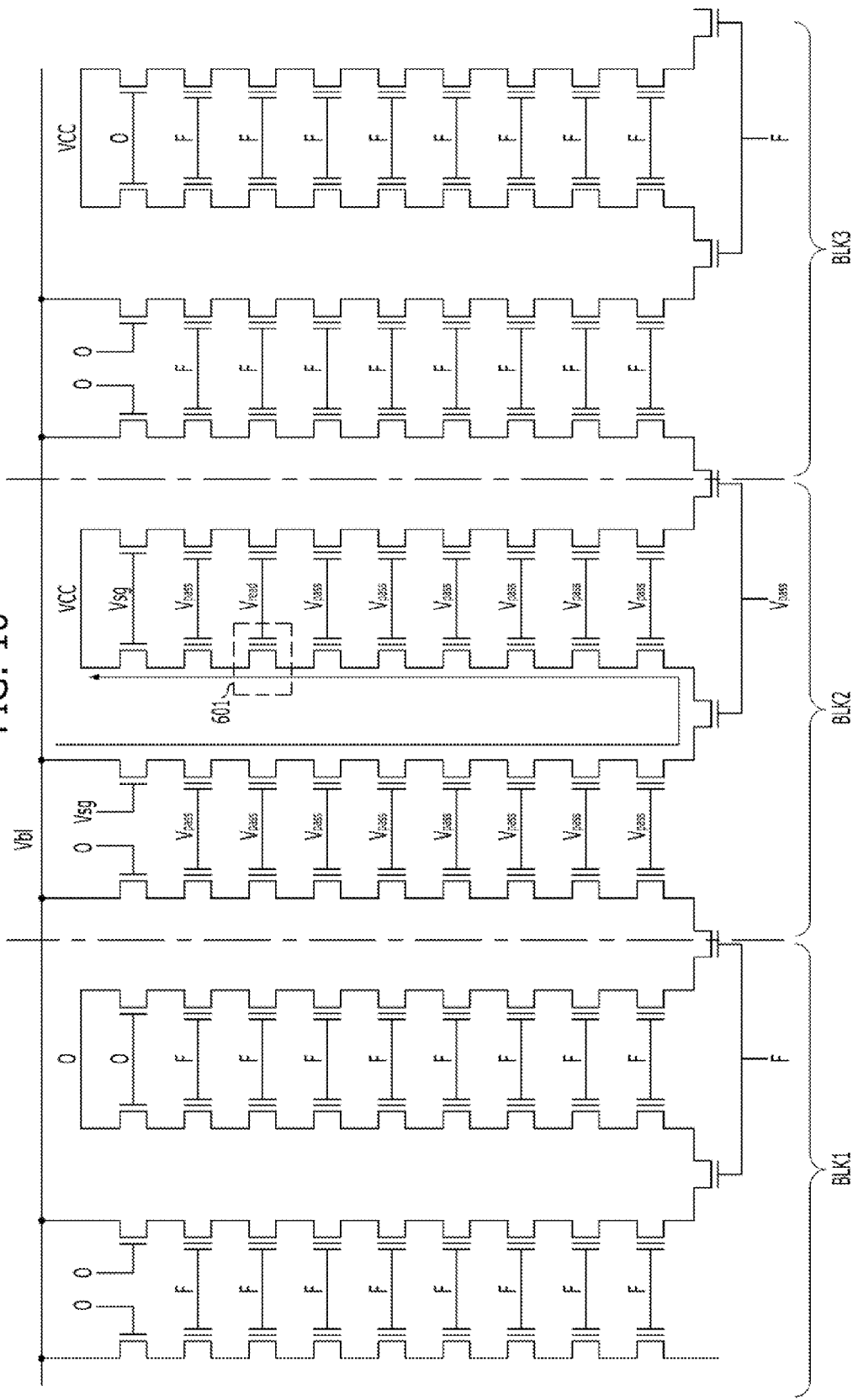
FIG. 10 is a diagram illustrating an exemplary operation for reading the memory cell 601 corresponding to the first word line WL1 in the complete string of the memory block BLK2.
Figure 11:
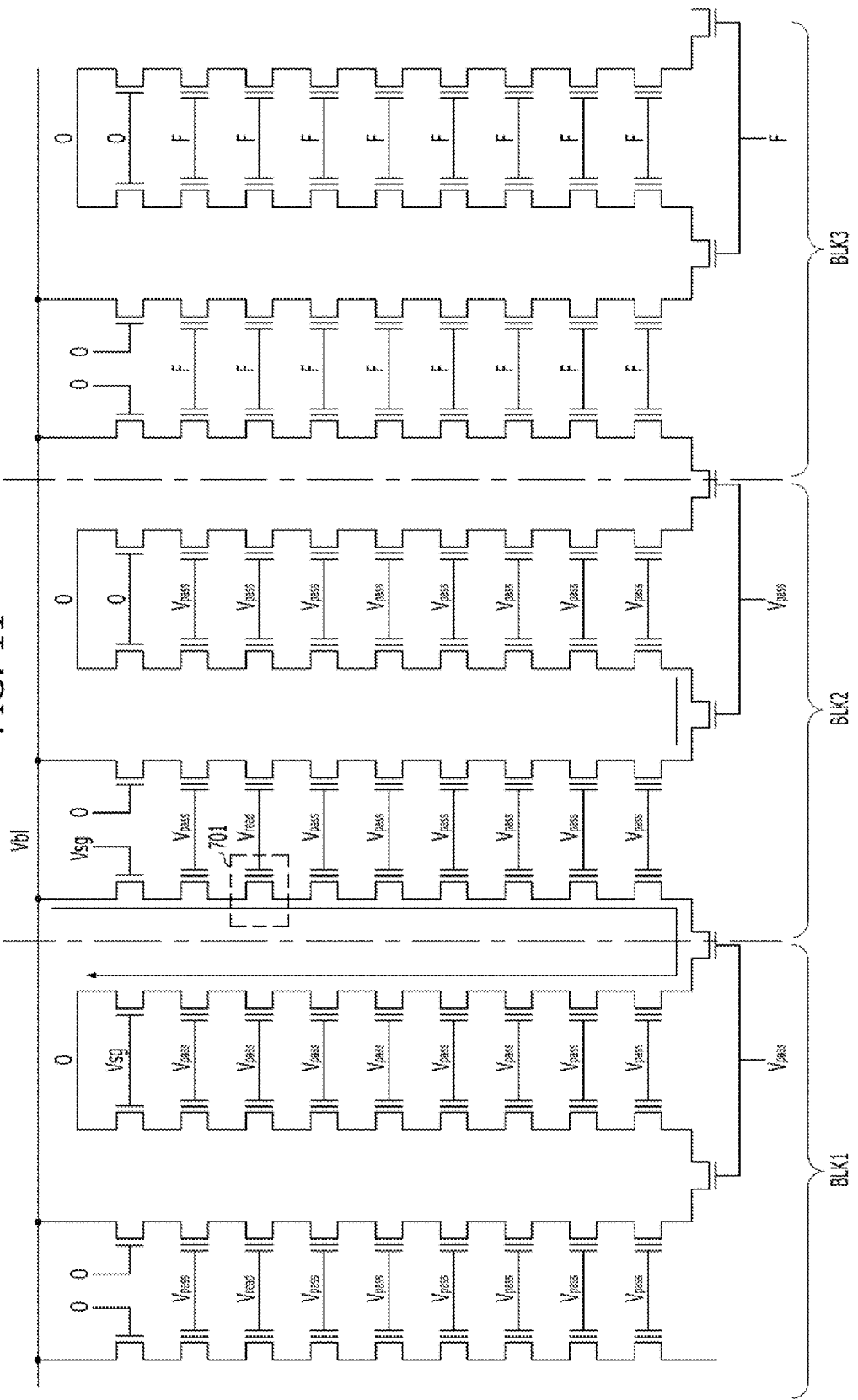
FIG. 11 is a diagram illustrating an exemplary operation for reading the memory cell 701 corresponding to the 14th word line WL14 in the drain-side half string of the memory block BLK2.
Figure 12:
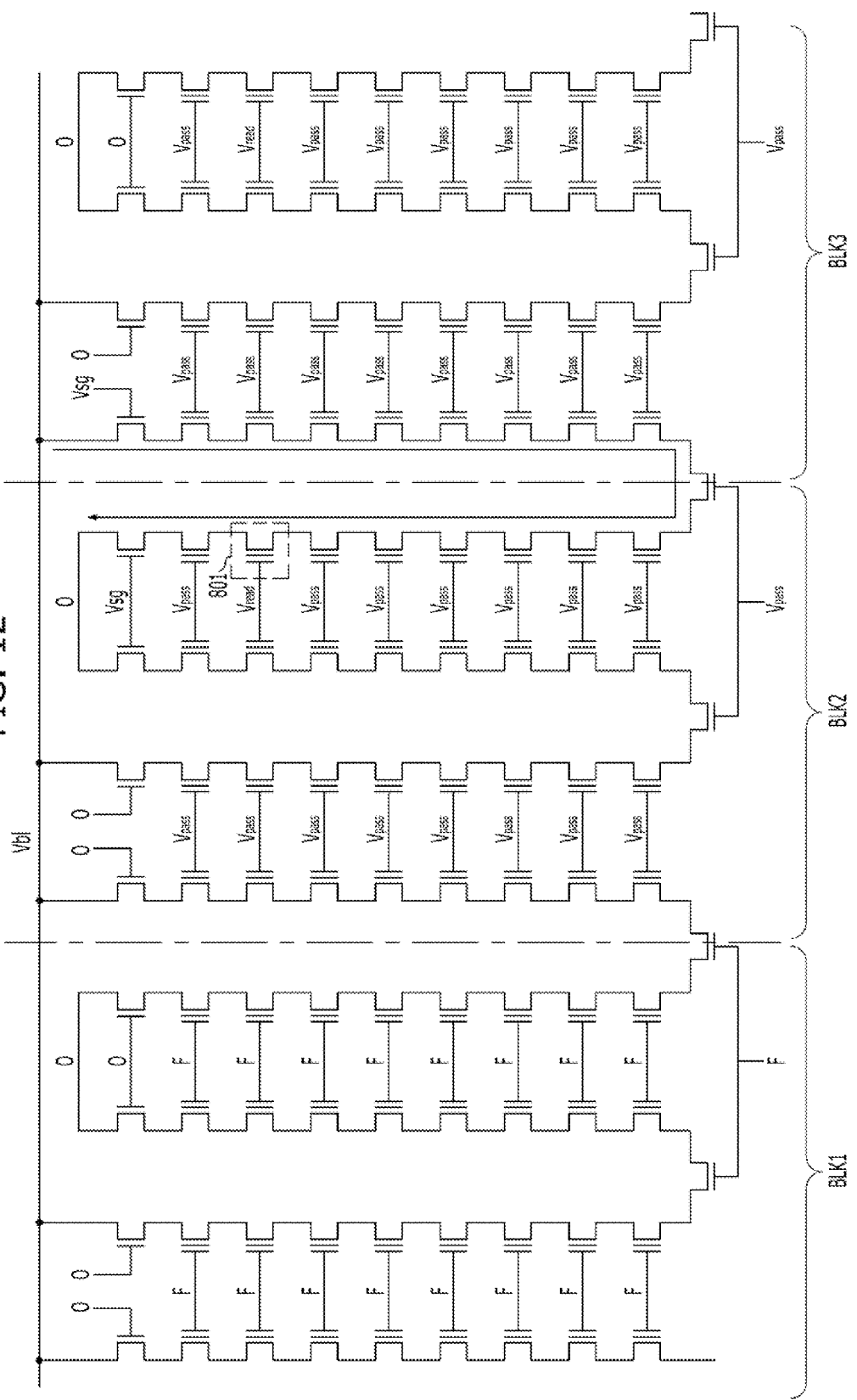
FIG. 12 is a diagram illustrating an exemplary operation for reading the memory cell 801 corresponding to the first word line WL1 in the source-side half string of the memory block BLK2.

An exemplary operation for reading exemplary nonvolatile memory device may implemented in different ways, depending on an operation for reading a complete string of a memory block, an operation for reading a drain-side half string, or an operation for reading a source-side half string. Referring to FIGS. 10 to 12, exemplary read operations will be described. The read operations may be more easily understood by referring to FIGS. 10 to 12 and FIG. 5.

FIG. 10 is a diagram illustrating an exemplary operation for reading the memory cell 601 corresponding to the first word line WL1 in the complete string of the memory block BLK2.

Referring to FIG. 10, a constant precharge voltage Vbl (for example, 1V) is applied to the bit line BL. Furthermore, the select voltage Vsg for turning on a corresponding transistor is applied to the drain select line DSL1 and the source select line SSL of the selected memory block BLK2. Then, a read voltage Vread is applied to the selected word line WL1 of the selected memory block BLK2, and a pass voltage Vpass may be applied to the unselected word lines WL0 and WL2 to WL15 and the pipe gate PG. Furthermore, the drain select lines DSL0 and DSL1 and the source select lines SSL of the unselected memory blocks BLK1 and BLK3 are at ground (0V), and the word lines WL0 to WL15 and the pipe gate PG are floated. As a result, when the threshold voltage of the memory cell 601 is lower than the read voltage Vread, a current path is formed through a string including the memory cell 601, and when the threshold voltage of the memory cell 601 is higher than the read voltage Vread, no current path is formed through the string including the memory cell 601. Thus, a voltage drop of the bit line BL, or a current flowing from the bit line BL to the source line SL, may be detected to read data stored in the memory cell 601.

FIG. 11 is a diagram illustrating an exemplary operation for reading the memory cell 701 corresponding to the 14th word line WL14 in the drain-side half string of the memory block BLK2.

Referring to FIG. 11, a constant precharge voltage Vbl may be applied to the bit line BL. Then, a select voltage Vsg may be applied to the drain select line DSL0 of the selected memory block BLK2. The select voltage Vsg may also applied to the source select line SSL of the memory block BLK1. During the read of the drain-side half string of the memory block BLK2, the same voltage may be applied to the word lines WL0 to WL15 and the pipe gate PG of the memory blocks BLK2 and BLK1, because the drain-side half string of the memory block BLK2 and the source-side half string of the memory block BLK1 must operate as one string. That is, in the blocks BLK1 and BLK2, the pass voltage Vpass is applied to the word lines WL0 to WL13 and WL15, the read voltage Vread may be applied to the word line WL14, and the pass voltage Vpass may be applied to the pipe gate PG. As a result, a current path may be formed or may not be formed through a string including the memory cell 701, depending on whether the threshold voltage of the memory cell 701 is lower/higher than the read voltage Vread. Whether the current path is formed or not may be detected to read data stored in the memory cell 701.

FIG. 12 is a diagram illustrating an exemplary operation for reading the memory cell 801 corresponding to the first word line WL1 in the source-side half string of the memory block BLK2.

Referring to FIG. 12, the constant precharge voltage Vbl is applied to the bit line BL. Furthermore, the select voltage Vsg may be applied to the drain select line DSL0 of the unselected block BLK3 instead of the selected block BLK2. The select voltage Vsg may also applied to the source select line SSL of the selected block BLK2. During the exemplary operation for reading the source-side half string of the memory block BLK2, the same voltage may be applied to the word lines WL0 to WL15 and the pipe gate PG of the memory blocks BLK2 and BLK3 because the source-side half string of the memory block BLK2 and the drain-side half string of the memory block BLK3 must operate as one string. That is, in the blocks BLK2 and BLK3, the pass voltage Vpass may be applied to the word lines WL0 to WL2 to WL15, the read voltage Vread may be applied to the word line WL1, and the pass voltage Vpass may be applied to the pipe gate PG. As a result, a current path may be formed or may not be formed through a string including the memory cell 801, depending on whether the threshold voltage of the memory cell 801 is lower/higher than the read voltage Vread. Whether the current path is formed or not may be detected to determine data stored in the memory cell 801.

In accordance with the exemplary implementation of the present invention, the word lines may be formed with a large width in the stacked nonvolatile memory. Thus, it is possible to prevent the increase of resistance and difficulty level of the fabrication process, caused by word lines with a small width.

Although an exemplary implementation have been described for illustrative purposes, it will be apparent to those skilled in the art that various changes and modifications may be made without departing from the spirit and scope of the invention as defined in the following claims.

What is claimed is:

1. A nonvolatile memory device comprising first to N-th memory blocks, wherein N is an integer and N≥3, and
    wherein each memory block, of the first to N-th memory blocks, comprises:
        first to (M−1)-th strings, wherein each string, of the first to (M−1)-th strings, includes drain-side memory cells, source-side memory cells, and a pipe transistor connecting the drain-side memory cells and the source-side memory cells, where M is an integer and M≥2; and
        an M-th string, including drain-side memory cells formed adjacent to the first string, of a first to (M−1)-th strings, and including source-side memory cells formed adjacent to an (M−1)-th string of the first to (M−1)-th strings
    wherein each of the first to N-th memory blocks corresponds to the unit of erase operation.

2. The nonvolatile memory device of claim 1, wherein the drain-side memory cells of an M-th string of an X-th memory block, of the first to N-th blocks, and the source-side memory cells of the M-th string of an (X−1)-th memory block, of the first to N-th memory blocks, are connected by a first pipe transistor, wherein X is an integer and 2≤X≤N−1, and wherein
    source-side memory cells of the M-th string of the X-th memory block and drain-side memory cells of the M-th string of an (X+1)-th memory block are connected by a second pipe transistor.

3. The nonvolatile memory device of claim 2, wherein each memory block, of the first to N-th memory blocks, the drain-side memory cells, of the first string, and the drain-side memory cells, of the M-th string, share word lines, and
    wherein the source-side memory cells, of the (M−1)-th string, and the source-side memory cells, of the M-th string, share word lines.

4. The nonvolatile memory device of claim 2, wherein during an operation for programming a drain-side memory cell, of the drain-side memory cells of the M-th string of the X-th memory block, the drain-side memory cells of the M-th string of the X-th memory block and the source-side memory cells of the M-th string of the (X−1)-th memory block are controlled to operate as one string.

5. The nonvolatile memory device of claim 2, wherein during an operation for programming a source-side memory cell, of the source-side memory cells of the M-th string of the X-th memory block, the source-side memory cells of the M-th string of the X-th memory block and the drain-side memory cells of the M-th string of the (X+1)-th memory block are controlled to operate as one string.

6. The nonvolatile memory device of claim 2, wherein during an operation for erasing the X-th memory block, an erase voltage is applied to an end of each string of the first to (M−1)-th strings, and a voltage lower than the erase voltage is applied to word lines corresponding to memory cells of the first to (M−1)-th strings.

7. The nonvolatile memory device of claim 6, wherein during the erase operation for the X-th memory block, word lines corresponding to memory cells of memory blocks, other than the X-th memory block, have the same voltage level as the erase voltage.

8. The nonvolatile memory device of claim 1, wherein each memory block, of the first to N-th memory blocks, comprises a plurality of the first to M-th strings.

9. A nonvolatile memory device comprising a plurality of memory blocks, wherein each memory block, of the plurality memory blocks, comprises:

a first plurality of drain-side memory cells arranged in a first drain-side string and a first plurality of source-side memory cells arranged in a first source-side string, wherein the first drain-side string and the first source-side string are connected by a first pipe transistor;

a second plurality of drain side memory cells arranged in a second drain-side string and a second plurality of source-side memory cells arranged in a second source-side string, wherein the second drain-side string is connected to a second source-side string of an adjacent memory block, of the plurality of memory block, via a second pipe transistor, and the second source-side string is connected to a second drain-side string, of a different adjacent memory block, of the plurality of memory blocks, via a third pipe transistor, wherein the each of memory blocks corresponds to the unit of erase operation.

10. The nonvolatile memory device of claim 9, wherein the plurality of memory blocks include a first memory block, a second memory block arranged adjacent to the first memory block, and a third memory block arranged adjacent to the second memory block.

11. The nonvolatile memory device of claim 10, wherein during an operation to program a second drain-side string of the second memory block, the second drain-side string of the second memory block and the second source-side string of the first memory block are controlled to operate as one string.

12. The nonvolatile memory device of claim 10, wherein during an operation to program the second source-side string of the second memory block, the second source-side string of the second memory block and the second drain-side string of the third memory block are controlled to operate as one string.

* * * * *